United States Patent
Fang et al.

(10) Patent No.: US 7,713,855 B2
(45) Date of Patent: May 11, 2010

(54) METHOD FOR FORMING BIT-LINE CONTACT PLUG AND TRANSISTOR STRUCTURE

(75) Inventors: Yu-Chung Fang, Taipei County (TW); Hong-Wen Lee, Tao-Yuan City (TW); Kuo-Chung Chen, Taipei County (TW); Jen-Jui Huang, Taoyuan County (TW); Jing-Kae Liou, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 257 days.

(21) Appl. No.: 11/780,484

(22) Filed: Jul. 20, 2007

(65) Prior Publication Data

US 2008/0268640 A1    Oct. 30, 2008

(30) Foreign Application Priority Data

Apr. 27, 2007    (TW) ............................... 96114888 A (51) Int. Cl.
*H01L 21/3205* (2006.01)
*H01L 21/4763* (2006.01)

(52) U.S. Cl. .................. 438/586; 438/672; 438/675; 257/E21.658

(58) Field of Classification Search ............... 438/586, 438/675, 672; 257/E21.658
See application file for complete search history.

(56) References Cited

U.S. PATENT DOCUMENTS

| 5,240,872 | A | * | 8/1993 | Motonami et al. | 438/253 |
| 5,527,738 | A | * | 6/1996 | Koh et al. | 438/654 |
| 6,171,954 | B1 | | 1/2001 | Hsu | |
| 6,406,971 | B1 | * | 6/2002 | Chien et al. | 438/398 |
| 2002/0090837 | A1 | * | 7/2002 | Chung et al. | 438/980 |
| 2003/0155595 | A1 | * | 8/2003 | Okita | 257/295 |
| 2005/0136594 | A1 | * | 6/2005 | Kim | 438/257 |
| 2007/0178642 | A1 | * | 8/2007 | Kim et al. | 438/244 |

FOREIGN PATENT DOCUMENTS

CN        1236979 A      12/1999
DE   199 35 852 A1       2/2001

* cited by examiner

*Primary Examiner*—Michelle Estrada
(74) *Attorney, Agent, or Firm*—Winston Hsu (57) ABSTRACT

A method for forming a bit-line contact plug includes providing a substrate including a transistor which includes a gate structure and a source/drain at both sides of the gate structure; forming a conductive layer, a bit-line contact material layer and a hard mask layer; performing an etching process using the conductive layer as an etching stop layer to etch the bit-line contact material layer and the hard mask layer and forming the bit-line contact plug on the source/drain. A transistor structure includes a gate structure and a source/drain at both sides of the gate structure, a conductive layer covering part of the gate structure and connected to the source/drain, and a bit-line contact plug disposed on the conductive layer and directly connected to the conductive layer.

18 Claims, 7 Drawing Sheets

METHOD FOR FORMING BIT-LINE CONTACT PLUG AND TRANSISTOR STRUCTURE

BACKGROUND OF THE INVENTION

1. Field of the Invention

The present invention relates to a method for forming a bit-line contact plug, and more particularly, the present invention relates to a method for forming a bit-line contact plug by directly etching the bit-line contact material layer.

2. Description of the Prior Art

In the semiconductor process, the single transistor with the constructed gate, source and drain usually requires contact plugs to form the electrical connections between the elements. It is known in the conventional method that a borophosphosilicate glass (BPSG) layer is first formed on the transistor then the positions of the contact plugs are defined by a photoresist layer. A conductive material is filled in the contact holes after the BPSG layer is etched away, to complete the fabrication of the bit-line contact plugs.

However, with the trend of narrower line widths, the inevitable alignment error while defining the contact plug positions causes misaligned contact holes, the failure of elements, and damage in the insulation of the gate structure. Therefore, a novel method is needed to form bit-line contact plugs for patterns with narrower line widths.

SUMMARY OF THE INVENTION

The present invention provides a method for forming a bit-line contact plug and a metal oxide semiconductor (MOS) structure. For reasons that the present invention first forms the conductive layer as an etch-stop layer then directly etches the bit-line contact material layer to define the position of the contact plugs, the problem of misalignment causing damaged gate structure insulation and subsequent element failure is therefore avoided.

The method for forming a bit-line contact plug of the present invention includes:

providing a substrate with a transistor including a gate structure and a source/drain adjacent to the both sides of the gate structure in the substrate;

forming a conductive layer, a bit-line contact material layer, and a hard mask layer on the substrate; and using the conductive layer as an etching stop layer to perform a first etching process to etch the hard mask layer and the bit-line contact material layer to form the bit-line contact plug on the source/drain.

Preferably, after the first etching process, the method of the present invention may further include:

forming an oxide protection layer to cover the sidewalls of the bit-line contact plug;

performing a second etching process to remove the exposed conductive layer;

removing the hard mask layer;

forming a dielectric layer to completely cover the gate structure and the bit-line contact plug; and selectively removing the dielectric layer to expose the bit-line contact plug.

In another aspect, the present invention provides a transistor structure including a metal oxide semiconductor (MOS) structure on a substrate, the MOS including a gate structure and a source/drain at both sides of the gate structure, a conductive layer on the substrate for covering part of the gate structure, for extending to the source/drain and for electrically connecting the source/drain, a bit-line contact plug disposed on the conductive layer and directly connected to the conductive layer, and a dielectric layer between the bit-line contact plug and other neighboring contact plugs.

The feature of the MOS structure of the present invention resides in that the electrical connection between bit-line contact plugs and the source/drain is formed through the conductive layer. The conductive layer may be deemed as a protective layer to protect the insulation of the gate structure from damage during the manufacturing process and from failure.

These and other objectives of the present invention will no doubt become obvious to those of ordinary skill in the art after reading the following detailed description of the preferred embodiment that is illustrated in the various figures and drawings.

DETAILED DESCRIPTION

The present invention first provides a method for forming a bit-line contact plug and a MOS structure. The present invention first forms a conductive material as an etch-stop layer on the MOS structure to avoid damaging the insulation of the gate structure due to misalignment during following etching procedures. In addition, there is no contact window formed in the method of the present invention, but instead the position of the contact plug is defined by directly etching the bit-line contact material layer. Accordingly, the present invention is suitable for the semiconductor process of smaller critical dimensions.

Figure 1A:
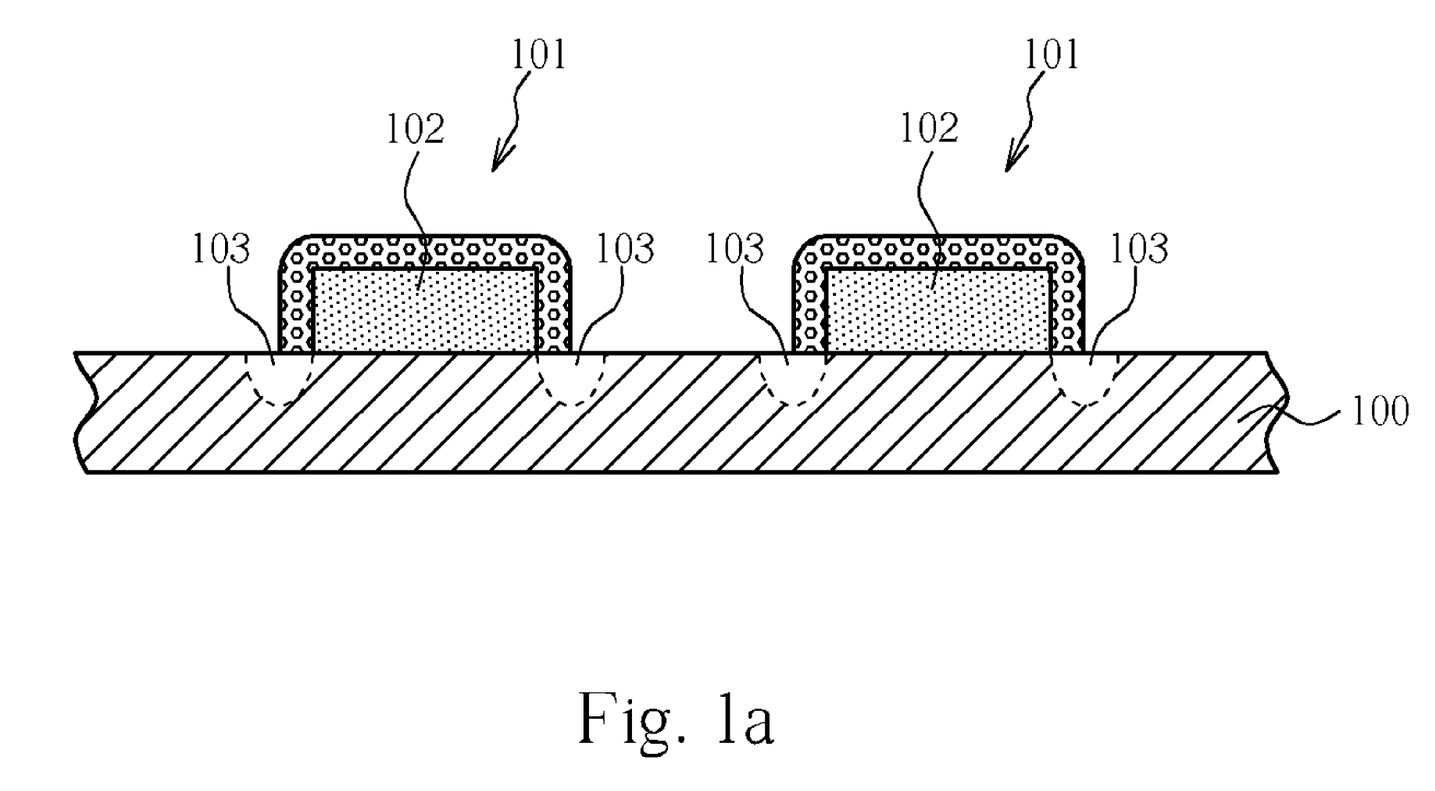
FIG. 1a to FIG. 1f illustrate a preferred embodiment of the method for forming a bit-line contact plug of the present invention.

FIG. 1a to FIG. 1f illustrate a preferred embodiment of the method for forming a bit-line contact plug of the present invention. As shown in FIG. 1a, first the transistor 101, which includes a conventional gate structure 102 and a source/drain 103 adjacent to the both sides of the gate structure 102 in the substrate 100, is formed on the substrate 100. The substrate 100 may include a semiconductor material, such as silicon (Si). The transistor 101 may use any suitable method to be formed onto substrate 100.

Figure 1B:
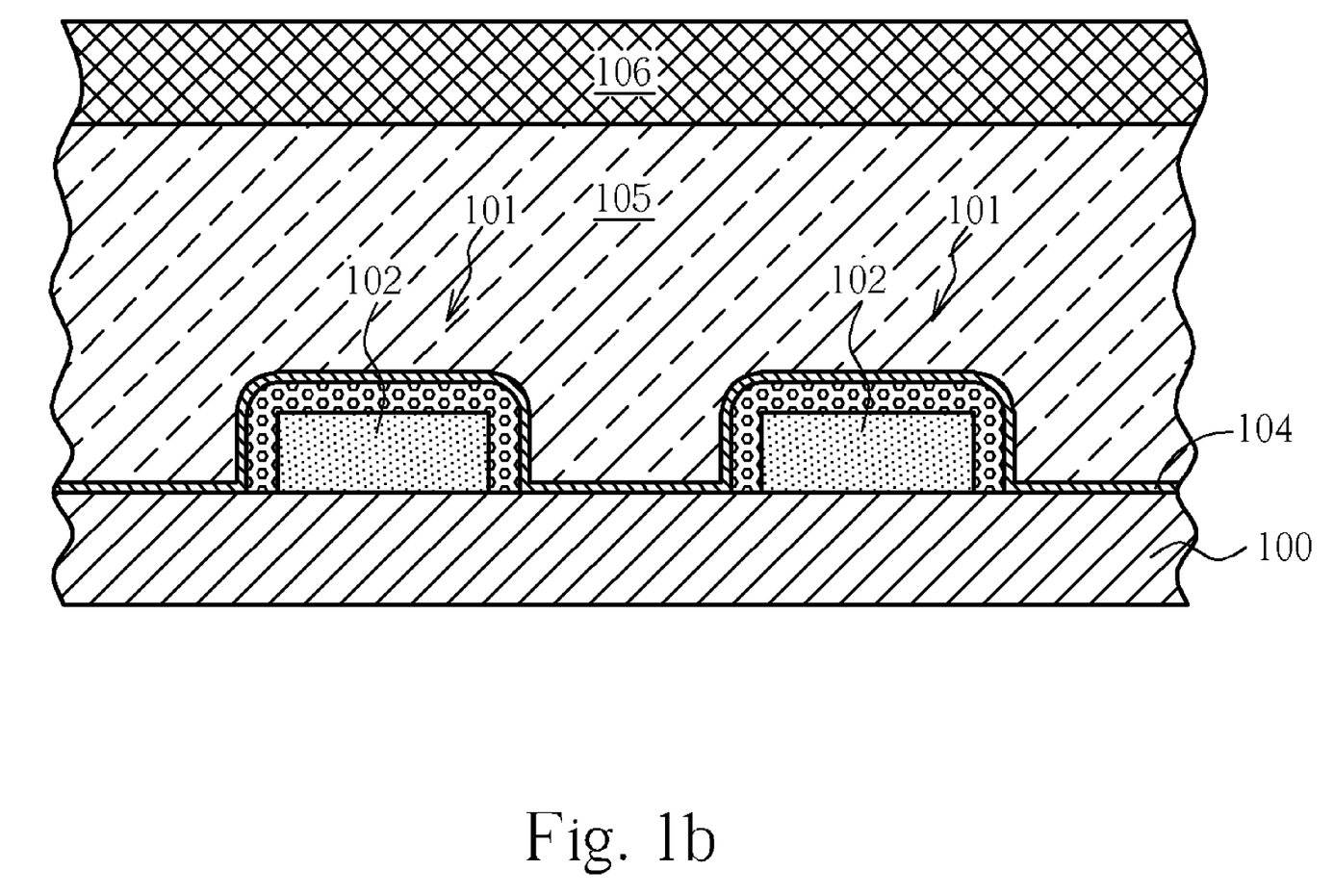

Then, as shown in FIG. 1b, a conductive layer 104, a bit-line contact material layer 105, and a hard mask layer 106 are formed on substrate 100. The conductive layer 104 may preferably include a metal material, such as titanium nitride, titanium, or a combination thereof, with a thickness of 10-40 nm. The conductive layer 104 may be formed by physical vapor deposition (PVD). The bit-line contact material layer 105 may preferably include a metal material, such as tungsten (W), by chemical vapor deposition (CVD) to have a thickness of 350-500 nm. The hard mask layer 106 usually includes an oxide, such as silicon oxide. The hard mask layer 106 may be formed by CVD to have a thickness of 500-700 nm.

Figure 1C:
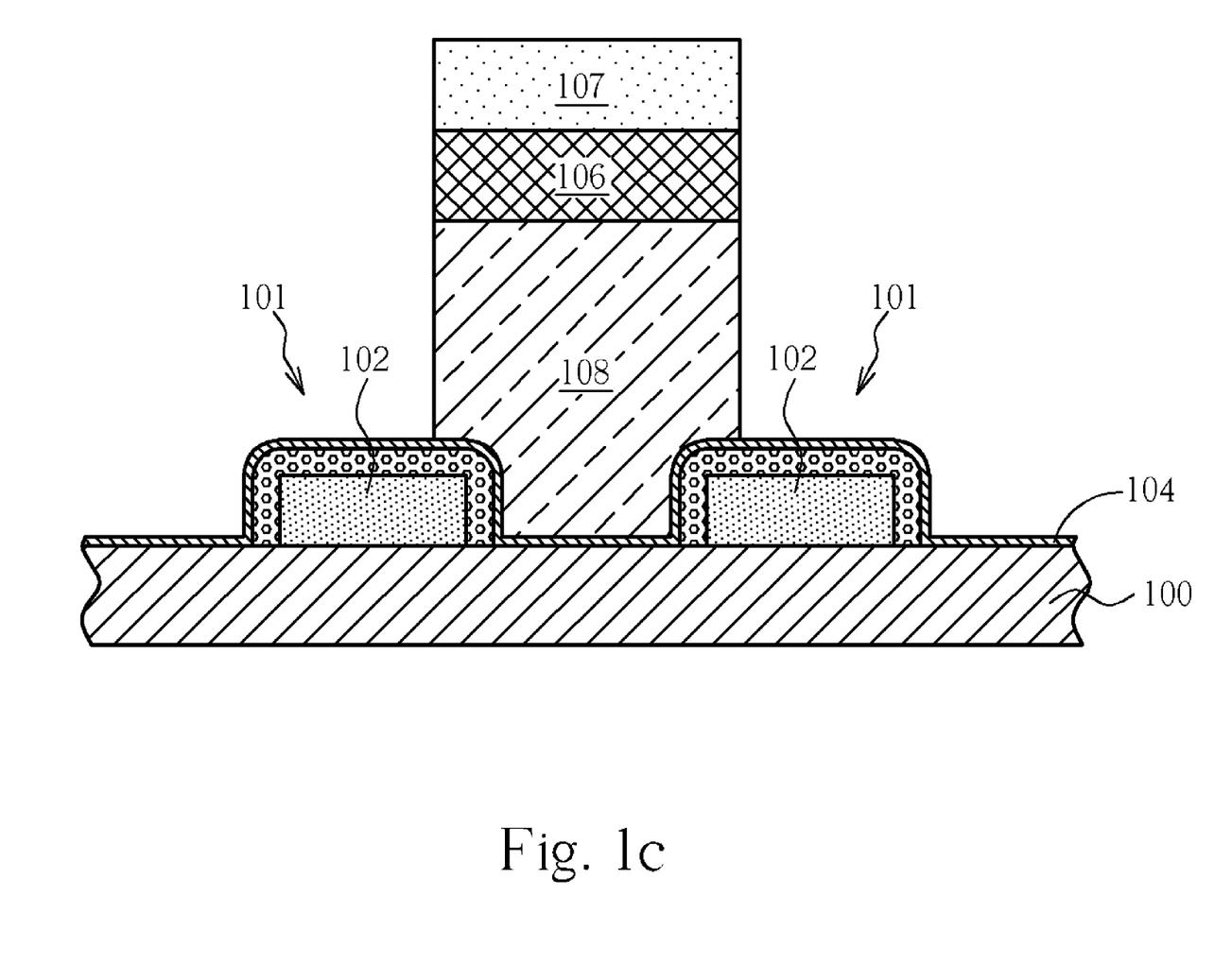

Later, as shown in FIG. 1c, a first etching process is performed. The bit-line contact plug 108 is defined by the photoresist 107 using the conductive layer 104 as an etching-stop layer and the mixture of $C_xF_y/CH_xF_y$ as an etchant to etch the hard mask layer 106, and using the mixture of $HBr/Cl_2/NF_3$ as an etchant to etch the bit-line contact material layer 105, to form the bit-line contact plug 108 on the source/drain 103.

The present invention first forms the conductive material 104 as an etch-stop layer on the transistor 101. By doing so, the insulation of the gate structure will not be compromised even if any misalignment occurs during following etching procedures. In addition, no contact window is formed in the present invention, but instead the position of the contact plug 108 is defined by directly etching the bit-line contact material layer 105. In the conventional method of forming the contact windows, high aspect ratios problematically lead to etching profiles, quality control difficulties, insufficient contact area, and etching residues. In the present invention, however, no contact holes with a high aspect ratio are formed because the present invention defines the position of the contact plug by directly etching the bit-line contact material layer. This method becomes especially suitable for semiconductor processes of smaller and smaller critical dimensions.

Figure 1D:
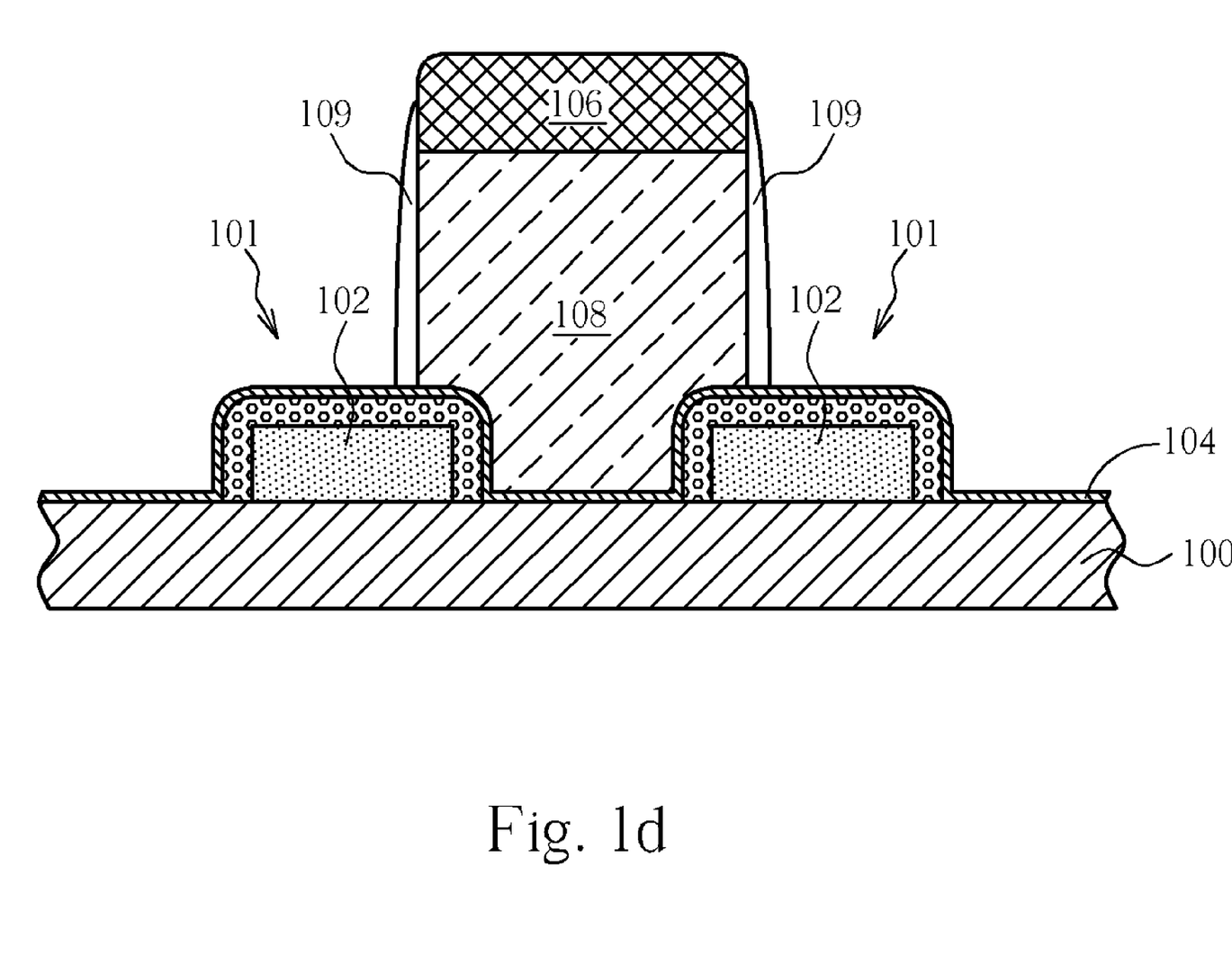

To construct the electrical connection between the bit-line contact plug 108 and other bit-line contact plugs (not shown) after the first etching process, the present invention may further include forming the oxide protection layer 109 with a thickness of about 20-30 nm to cover the sidewalls of the bit-line contact plug 108, as shown in FIG. 1d. For example, the step of forming the oxide protection layer 109 may include first evenly depositing an oxide layer after stripping the photoresist 107, such as by ashing. The oxide layer on the conductive layer 104 may be removed later by an anisotropic dry etching procedure to leave the oxide protection layer 109 on the bit-line contact plug 108. During the anisotropic dry etching procedure, the shoulder of the hard mask 106 may be rounded from the etching, as shown in FIG. 1d.

A second etching process is then carried out to remove the exposed conductive layer 104. The second etching process may preferably be a wet acid etching process to selectively remove the metal, such as using the AMP etchant to completely remove the conductive layer 104.

Figure 1E:
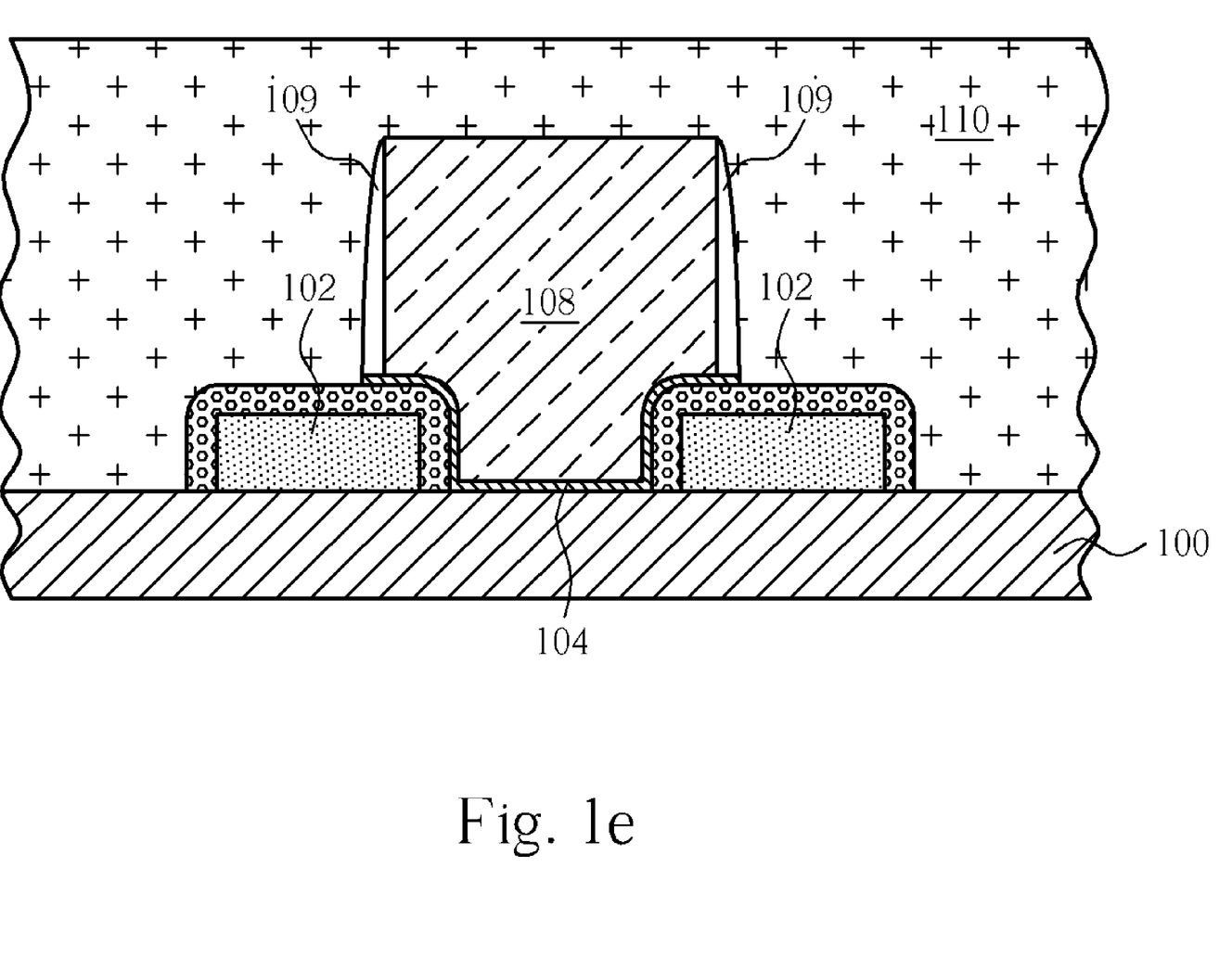

After the hard mask 106 is removed, a dielectric layer 110 entirely covering the gate structure 102 and the bit-line contact plug 108 is formed, as shown in FIG. 1e. Preferably, the dielectric layer 110 may be planarized using a chemical-mechanical planarization (CMP) process. The dielectric layer 110 may include a doped silicate glass, such as borophosphosilicate glass (BPSG). The thickness of the dielectric layer 110 depends on that of the bit-line contact plug 108 and the total thickness of the metal layer.

Figure 1F:
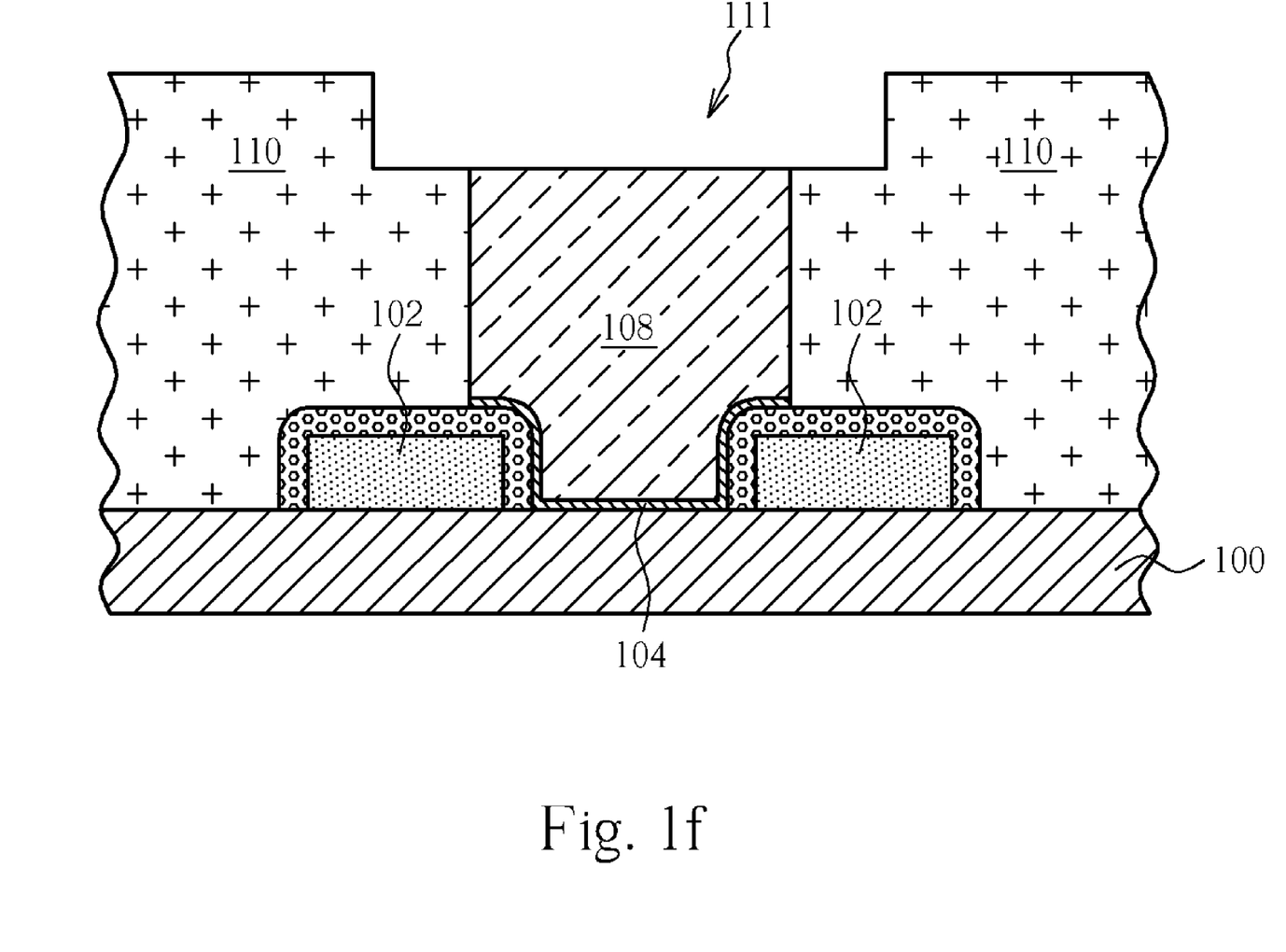

Later, an exposed region 111 of the bit-line contact plug 108 is defined by a photoresist to selectively remove the dielectric layer 110 by etching, as shown in FIG. 1f. A suitable conductive material, such as tungsten, may fill the exposed region 111 to construct the electrical connection between the bit-line contact plug 108 and other bit-line contact plugs (not shown).

Figure 2:
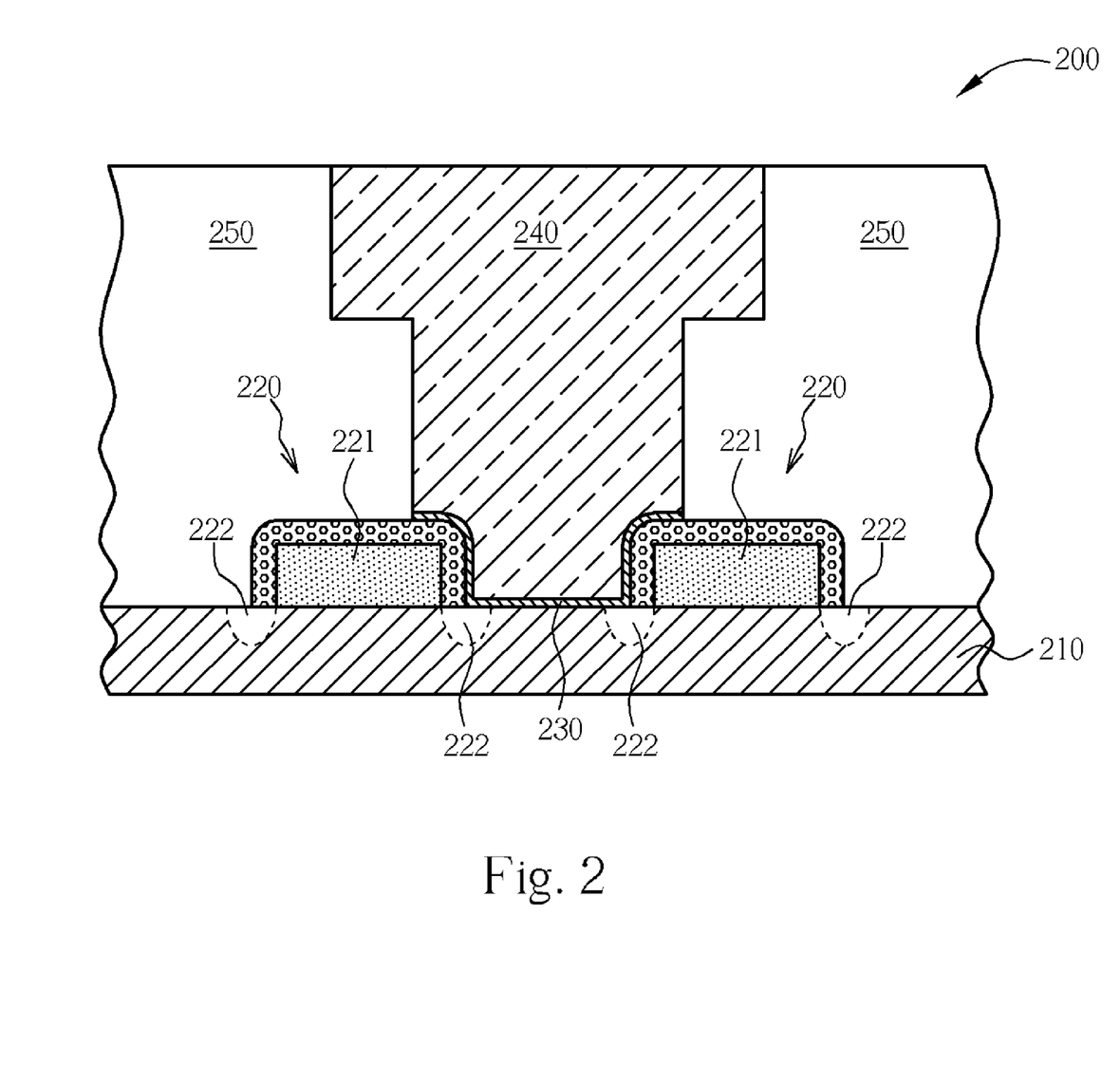
FIG. 2 illustrates a preferred embodiment of the transistor structure of the present invention.

In another form, the present invention provides a transistor structure as shown in FIG. 2. The transistor structure 200 includes a substrate 210, a metal oxide semiconductor (MOS) structure 220, a metal conductive layer 230, a bit-line contact plug 240, and a dielectric layer 250.

The substrate 210 may include a semiconductor material such as silicon. The metal oxide semiconductor structure 220 may use any suitable method to be formed on the substrate 210.

The MOS structure 220 may usually include a gate structure 221 and a source/drain 222. The source/drain 222 is disposed adjacent to the both sides of the gate structure 221 in the substrate.

The metal conductive layer 230 covers part of the gate structure 221 and extends to the source/drain 222. The metal conductive layer 230 may include a metal material such as titanium nitride, titanium, or a combination thereof, with a thickness of 10-40 nm. The metal conductive layer 230 electrically connects the source/drain 222, and it also protects part of the gate structure 221 from the damage due to etching.

The bit-line contact plug 240 is disposed on the metal conductive layer 230 and directly contacts the metal conductive layer 230. The bit-line contact plug 240 may include a metal material, such as tungsten, as the electrical connection of the source/drain 222 with a thickness of 350-500nm.

The dielectric layer 250 fills the space between the bit-line contact plug 240 and another neighboring bit-line contact plug (not shown) to ensure the insulation of the bit-line contact plug 240. Preferably, the dielectric layer 250 may include a doped silicate glass, such as BPSG. The thickness of the dielectric layer 250 depends on that of the bit-line contact plug 240.

Because there is a conductive layer in the transistor structure of the present invention, the electrical connection between the bit-line contact plug and the source/drain is formed. The conductive layer may be deemed as a protection layer to protect the insulation of the gate structure from damage during the manufacturing process and from failure.

Those skilled in the art will readily observe that numerous modifications and alterations of the device and method may be made while retaining the teachings of the invention.

What is claimed is:

1. A method for forming a bit-line contact plug comprising:
providing a substrate with a transistor including a gate structure and a source/drain adjacent to both sides of said gate structure in said substrate;
forming a conductive layer on said substrate;
forming a bit-line contact material layer on said conductive layer;
forming a hard mask layer on said bit-line contact material layer;
using said conductive layer as an etching stop layer to perform a first etching process to etch said hard mask layer and said bit-line contact material layer to form said bit-line contact plug on said source/drain;
forming an oxide protection layer to cover sidewalls of said bit-line contact plug; and
performing a second etching process to remove exposed portions of said conductive layer.

2. The method for forming a bit-line contact plug of claim 1, wherein said substrate is a semiconductor substrate.

3. The method for forming a bit-line contact plug of claim 1, wherein said conductive layer is selected from the group consisting of titanium nitride, titanium, or a combination thereof.

4. The method for forming a bit-line contact plug of claim 1, wherein said bit-line contact material layer comprises tungsten.

5. The method for forming a bit-line contact plug of claim 1, wherein a thickness of said bit-line contact material layer is between 350 nm-500 nm.

6. The method for forming a bit-line contact plug of claim 1, wherein said hard mask layer comprises oxide.

7. The method for forming a bit-line contact plug of claim 1 after said first etching process further comprising:
removing said hard mask layer;
forming a dielectric layer to completely cover said gate structure and said bit-line contact plug; and
selectively removing said dielectric layer to expose said bit-line contact plug.

8. The method for forming a bit-line contact plug of claim 7, wherein said second etching process is a wet etching process.

9. The method for forming a bit-line contact plug of claim 7, wherein said dielectric layer comprises doped silicate glass.

10. The method for forming a bit-line contact plug of claim 7, wherein said dielectric layer comprises borophosphosilicate glass.

11. A metal oxide semiconductor structure comprising:
   a substrate;
   a metal oxide semiconductor on said substrate, said metal oxide semiconductor comprising a gate structure and a source/drain adjacent to both sides of said gate structure in said substrate;
   a metal conductive layer on said substrate, said metal conductive layer covering part of said gate structure and extending to said source/drain and electrically connected to said source/drain;
   a bit-line contact plug on said metal conductive layer, said bit-line contact plug directly contacting said metal conductive layer;
   an oxide protection layer covering sidewalls of said bit-line contact plug; and
   a dielectric layer between said bit-line contact plug and another bit-line contact plug.

12. The MOS structure of claim 11, wherein said substrate is a semiconductor substrate.

13. The MOS structure of claim 11, wherein said metal conductive layer comprises titanium nitride.

14. The MOS structure of claim 11, wherein said metal conductive layer comprises titanium.

15. The MOS structure of claim 11, wherein said bit-line contact comprises a metal.

16. The MOS structure of claim 15, wherein said metal is tungsten.

17. The MOS structure of claim 11, wherein said dielectric layer comprises doped silicate glass.

18. The MOS structure of claim 11, wherein said dielectric layer comprises borophosphosilicate glass.

* * * * *